United States Patent [19]

Egawa et al.

[11] Patent Number: 5,436,481
[45] Date of Patent: Jul. 25, 1995

[54] MOS-TYPE SEMICONDUCTOR DEVICE AND METHOD OF MAKING THE SAME

[75] Inventors: Yuichi Egawa; Toshio Wada; Shoichi Iwasa, all of Tokyo, Japan

[73] Assignee: Nippon Steel Corporation, Japan

[21] Appl. No.: 182,989

[22] Filed: Jan. 19, 1994

[30] Foreign Application Priority Data

| Jan. 21, 1993 | [JP] | Japan | 5-027462 |
| Jan. 26, 1993 | [JP] | Japan | 5-029896 |
| Mar. 25, 1993 | [JP] | Japan | 5-090743 |

[51] Int. Cl.⁶ .................... H01L 27/02; H01L 21/265
[52] U.S. Cl. .................... 257/324; 257/327; 257/346; 257/411; 257/640; 437/42; 437/241; 437/243
[58] Field of Search ............. 257/324, 327, 411, 640, 257/346; 437/42, 241, 243, 920

[56] References Cited

U.S. PATENT DOCUMENTS 4,869,781 9/1989 Euen et al. .................... 257/411

OTHER PUBLICATIONS

Deep-Submicrometer CMOS Technology With Reoxidated or Annealed Nitrided-Oxide Gate Dielectrics Prepared By Rapid Thermal Processing, T. Hori, IEEE Transactions of Electron Devices, vol. 39, No. 1, Jan. 1992, pp. 118-126.

Improvement In Gate-Dielectric Characteristics Of Nitrated Oxides Prepared By Rapid Thermal Processing, T. Hori, Applied Physics vol. 60, No. 11 (1991), pp. 1127-1130.

*Primary Examiner*—Edward Wojciechowicz
*Attorney, Agent, or Firm*—Pollock, Vande Sande & Priddy

[57] ABSTRACT

A MOS semiconductor device and a method of making the same are arranged to include a semiconductor substrate of a first conductivity type; a pair of impurity diffused layers of a second conductivity type different from the first conductivity type formed in the semiconductor substrate and mutually separated by a distance of 0.1 µm or less; a gate insulating film including at least two layers of a silicon oxide film and a silicon nitride film and formed on a portion of the semiconductor substrate disposed between the pair of impurity diffused layers; and a gate electrode formed on the gate insulating film, wherein preferably the silicon nitride film has a thickness of 4.5 nm to 14.86 nm.

15 Claims, 11 Drawing Sheets

MOS-TYPE SEMICONDUCTOR DEVICE AND METHOD OF MAKING THE SAME

BACKGROUND OF THE INVENTION

1. FIELD OF THE INVENTION

This invention relates to a MOS-type semiconductor device and a method of making the same, and more particularly to a MOS-type semiconductor device using a gate insulating film including a silicon nitride film and a method of making the same.

2. DESCRIPTION OF THE RELATED ART

Partly because of the stability of the film itself in the manufacturing process and partly because of the excellent electrical insulation property, an $SiO_2$ film has been used as the gate insulating film for MOS-type transistors.

However, with the recent progressive microminiaturization of transistors, the problem of resistance against hot carriers has manifested itself. More specifically, the Si—O bond is broken by the hot carriers diffused into the SiO film and an interface level or a trap level is generated in the film, which are the causes of reducing the lifetime of the transistors. In addition, there is another problem that when an $SiO_2$ is formed, the $SiO_2$ entraps vacancies or metal impurities (Fe or Cu) in the semiconductor substrate, thus decreasing the dielectric strength of the gate insulating film, resulting in a reduction of the insulation property.

For this reason, as the gate insulating film of the MOS transistor, it has been proposed to use an ONO film of a three-layer structure including an oxide film ($SiO_2$ silicon dioxide), a nitride film ($Si_3N_4$ silicon nitride), and another oxide film ($SiO_2$ silicon dioxide). (As an example, refer to T. Hori et al.: "Deep-Submicrometer CMOS Technology with Reoxidized or Annealed Nitrided-Oxide Gate Dielectrics Prepared by Rapid Thermal Processing" IEEE TRANSACTIONS ON ELECTRON DEVICES, Vol. 39, No. 1, JANUARY 1992, pp. 118-126).

Figure 1:
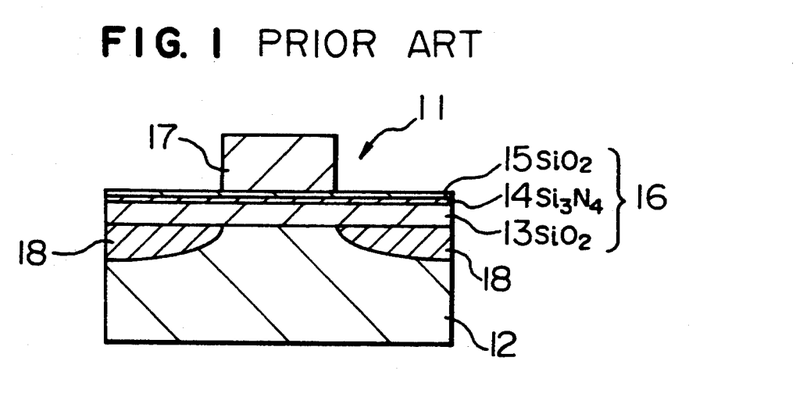
FIG. 1 is a sectional view showing the construction of a conventional MOS-type transistor.

FIG. 1 shows a schematic construction of a MOS transistor using an ONO film as the gate insulating film. To produce this MOS transistor 11 by the method in the above paper, a $SiO_2$ film 13 is formed on the surface of a Si substrate 12 by thermal oxidation process, a $Si_3N_4$ film 14 is formed by rapid thermal nitridation on the surface of the $SiO_2$ film by RTP (Rapid Thermal Processing), and a $SiO_2$ film 15 is formed by re-oxidizing the surface of the $Si_3N_4$.

Those films 13 to 15 constitute an ONO film 16 to serve as the gate insulating film, and on the ONO film 16, a polycrystalline Si film 17 is formed in a pattern of the gate electrode, and diffused layers 18 of the source and the drain are formed in the Si substrate at both sides of the polycrystalline Si film 17.

Since the bond energy of the Si—n bond in the silicon nitride film is greater than that of Si—O bond, the ONO film 16 of the MOS transistor thus produced is more excellent in the resistance against hot carriers and the TDDB (Time Dependent Dielectric Breakdown) characteristics than the $SiO_2$ film alone.

In order to suppress the short channel effect derived from microminiaturization, it becomes more frequent to introduce P-type impurities, in place of N-type impurities, into the polycrystalline Si film serving as the gate electrode of P-channel MOS transistors. In this case, the gate insulating film using the ONO film 16 is effective to suppress the boron used as the P-type impurities penetrating through the gate insulating film.

As described above, when a gate-insulating ONO film is used, the ability of suppressing the impurity diffusion is improved and, therefore, the effect of suppressing the impurities punching through the gate insulating film from the gate electrode is enhanced. It has been reported that in a MOS transistor using a nitrided, oxidized film formed (reoxidation) by RTP, electron trapping is also suppressed by the reoxidation, and additionally, the hot carrier reliability is improved better than in the case where the gate insulating film is formed only by an oxidized film.

(T. Hori: "Improvement in Gate Insulating Film Characteristics by Nitride and Oxide Film Prepared by Rapid Thermal Processing", Applied Physics, Vol. 60, No. 11 (1991), pp. 1127-1130).

However, in a MOS transistor using an ONO film, there is a problem that the peak values of the transconductance indicative of the current drive capacity of the transistor become lower than in the case where the gate insulating film is formed only by an oxide film.

Figure 2A:
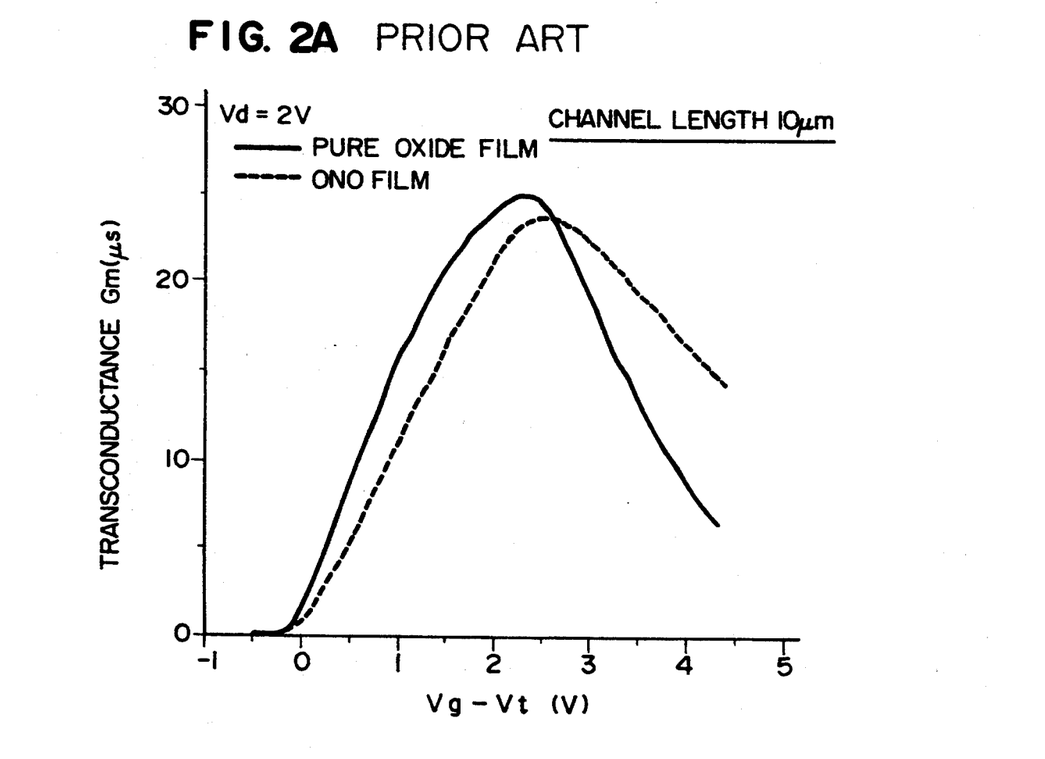
FIGS. 2A, 2B and 2C are diagrams showing comparisons between $SiO_2$ film and ONO film used as the gate insulating film regarding the relationships between $Vg-Vt$ and the transconductance in MOS transistors with channel lengths of 10 μm, 0.3 μm, and 0.1 μm, respectively.
Figure 2B:
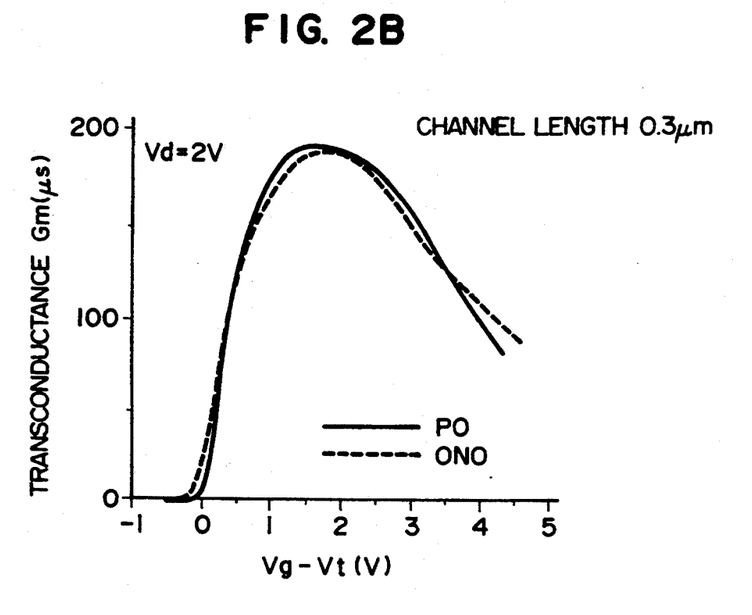

FIGS. 2A and 2B show the Vg—Vt dependence of the transconductance of the 10-$\mu$m-channel and 0.3-$\mu$m-channel transistors using ONO film and pure oxide film as the gate insulating films, respectively when the drain-source voltage Vd=2 V, where Vg is the gate voltage and Vt is the threshold voltage. One can find from FIGS. 2A and 2B that the peak values of the transconductance of the transistors using the ONO film are lower than those of the transistors using the pure oxide film.

SUMMARY OF THE INVENTION

A first object of the present invention is to provide a MOS-type semiconductor device using a gate insulating film including at least two layers of a nitride film and an oxide film, and having a transconductance not lower than the transconductance of a MOS-type semiconductor device using a gate insulating film including only an oxide film.

A second object of the present invention is to provide a method of making a MOS-type semiconductor device using a gate insulating film including at least two layers of a nitride film and an oxide film and having a transconductance not lower than the transconductance of a MOS-type semiconductor device using a gate insulating film, including only an oxide film, wherein the nitride film with a sufficient thickness can be formed without causing the wafer to warp.

The MOS-type semiconductor device according to the present invention comprises a semiconductor substrate of a first conductivity type; a pair of impurity-diffused layers of a second conductivity type different from the first conductivity type formed in the semiconductor substrate and separated from each other by a distance of 0.1 $\mu$m or less; a gate insulating film including at least two layers of a silicon oxide film and a silicon nitride film formed on a portion of said semiconductor substrate between the pair of impurity-diffused layers; and a gate electrode formed on said gate insulating film.

A method of making a MOS-type semiconductor device comprises the steps of: forming a gate insulating film including at least two layers of a silicon oxide film and a silicon nitride film on a first region of a semiconductor substrate of a first conductivity type, the silicon nitride film being formed by chemical vapor deposition;

forming a gate electrode on the gate insulating film; and forming by using said gate electrode as a mask a pair of impurity-diffused layers of a second conductivity type different from the first conductivity type in a pair of second regions contiguous to and extending on both sides of the first region of the semiconductor substrate.

The MOS-type semiconductor device according to the present invention, because it uses the gate insulating film including at least two layers of a silicon oxide film and a silicon nitride film, is excellent in the hot carrier resistance and the TDDB characteristics, and because the channel length is 0.1 μm or less, has a transconductance at about the same level as that of a MOS-type semiconductor device using a gate insulating film formed only by a silicon oxide film.

In the method of manufacturing a MOS-type semiconductor device according to the present invention, since this method uses, when the gate insulating film including two layers of a silicon oxide film and a silicon nitride film, the chemical vapor deposition for forming the silicon nitride film, the thickness of the silicon nitride film can be controlled relatively freely. For this reason, by suitably selecting the thickness of the silicon nitride film, it is possible to manufacture a MOS-type semiconductor device which can be driven with a high drive voltage and operate at high speed.

DESCRIPTION OF THE PREFERRED EMBODIMENTS

The manufacturing steps of a MOS transistor according to a first embodiment of the present invention will be described with reference to FIGS. 4A to 4D and 5.

FIGS. 4A to 4D are sectional views of a MOSFET at the respective steps of the manufacturing process thereof according to the first embodiment of the present invention.

As shown in FIG. 4, an element-isolating oxide film 22 is formed on a P-type semiconductor substrate 21, and then a silicon oxide film as the lower component of a gate insulating film is formed to a thickness of, say, 5 nm by using a resistance heating type furnace. Subsequently, by performing nitriding and oxidizing by RTP, an ONO film 23 is formed as the gate insulating film. The process conditions are such that, for example, nitridation is carried out in an atmosphere of $NH_3$ at 1000° C. for 120 seconds and oxidizing in an atmosphere of $O_2$ at 1100° C. for 60 seconds. It is worth mentioning that if $N_2O$ is used as the atmosphere for nitriding, the subsequent oxidizing process can be omitted. The silicon nitride film as a component of the ONO film 23 is preferably formed by the CVD process.

Figure 4A:
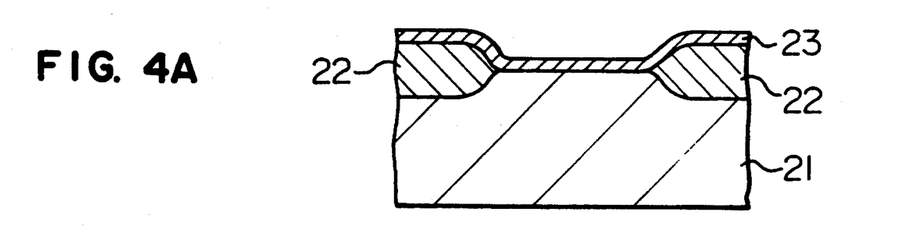
FIGS. 4A to 4D are diagrams for explaining the manufacturing steps of a MOS semiconductor device according to a first embodiment of the present invention.
Figure 4B:
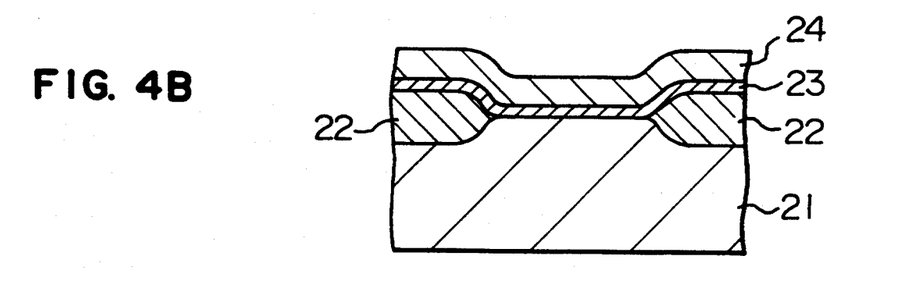

Then, as shown in FIG. 4B, a polysilicon 24 is deposited to a thickness of 300 nm by the CVD process.

Figure 4C:
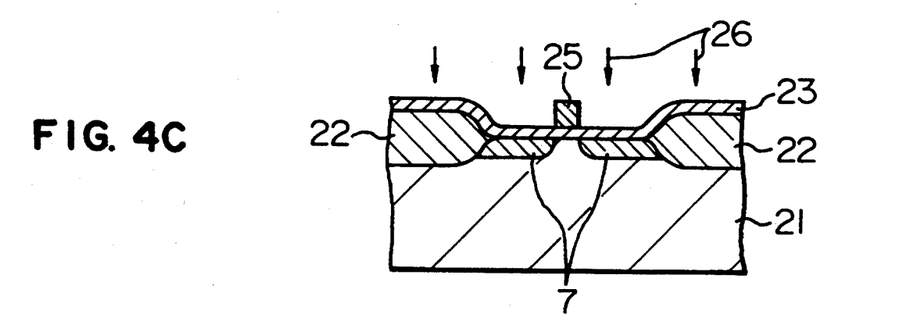

Subsequently, as shown in FIG. 4C, after a photoresist (not shown) is applied, it is exposed by an electron beam (EB) exposure process, and the polysilicon film 24 is dry-etched for patterning of a gate electrode 25 having a gate length of 0.1 μm or less. After this, by implanting ions of N-type impurities, source and drain diffused layers 27 are formed.

Figure 4D:
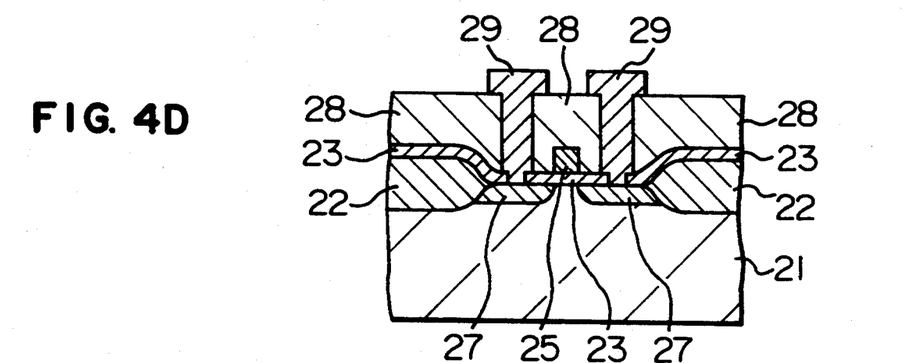

Thereafter, as shown in FIG. 4D, an interlayer insulating film 28 is formed over the whole surface of the semiproduct, and source and drain leader electrodes 29 are formed, respectively, through contact-holes formed in the interlayer insulating film 28 and the ONO film 23 underneath.

Figure 2C:
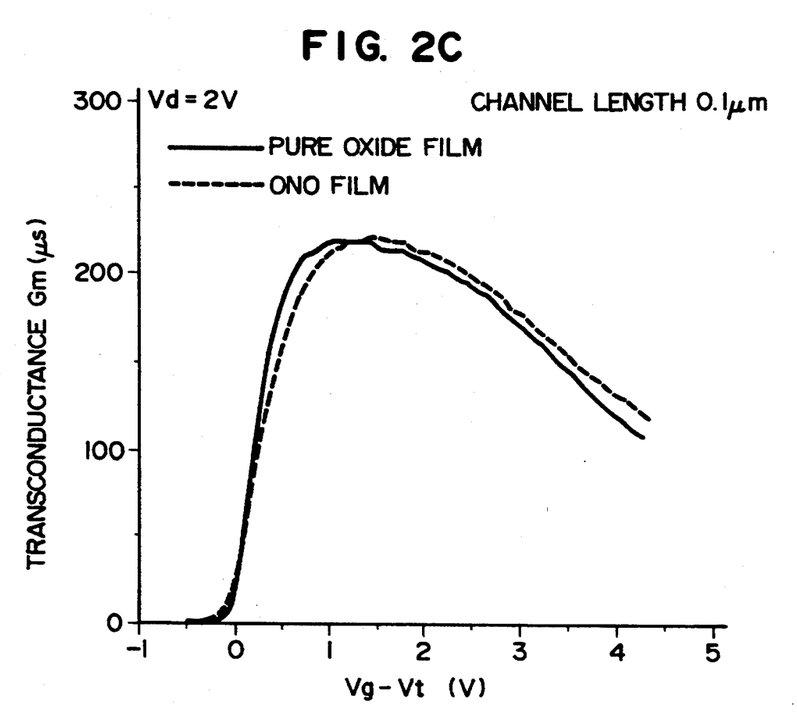

FIG. 2C shows the (Vg−Vt) dependence of the transconductance in a MOSFET having a channel length of 0.1 μm with an ONO gate insulating film obtained by this embodiment and a MOSFET having a channel length of 0.1 μm with a pure oxide gate insulating film. It is understood from FIG. 2C that the peak value of the transconductance of the 0.1-μm channel MOSFET obtained according to this embodiment is substantially equal to or slightly higher than that of the MOSFET with a pure oxide film.

Figure 2D:
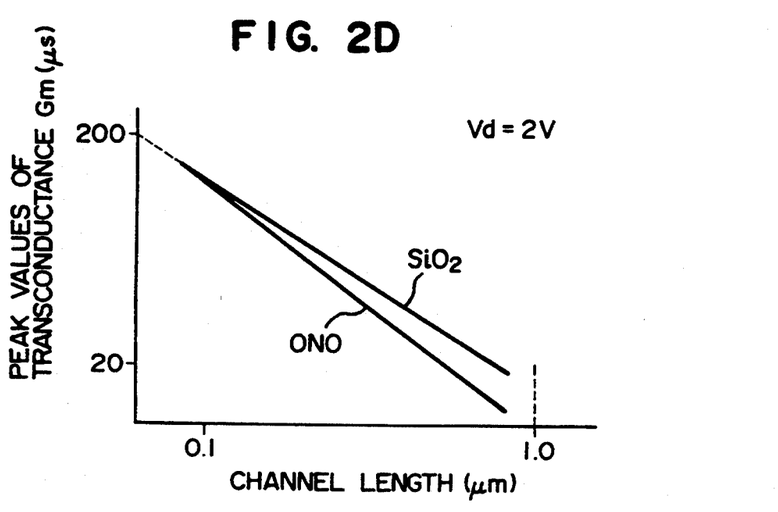
FIG. 2D is a diagram showing a comparison between $SiO_2$ film and ONO film used as the gate insulating film regarding the relationship between the channel length and the peak value of the transconductance in MOS transistors.

FIG. 2D is a diagram showing a comparison between $SiO_2$ film and ONO film used as the gate insulating film regarding the relationship between the channel length and the peak value of the transconductance Gm of MOS transistors when Vd=2 volts. As seen from this diagram, when the channel length is longer than 0.1 μm, the peak value of the transconductance of a MOSFET having ONO film is lower than that of a MOSFET having $SiO_2$ film, and when the channel length is shortened to 0.1 μm, the peak value of the transconductance of the MOSFET with ONO film is the same as that of the MOSFET with SiO$_2$ film.

Figure 3:
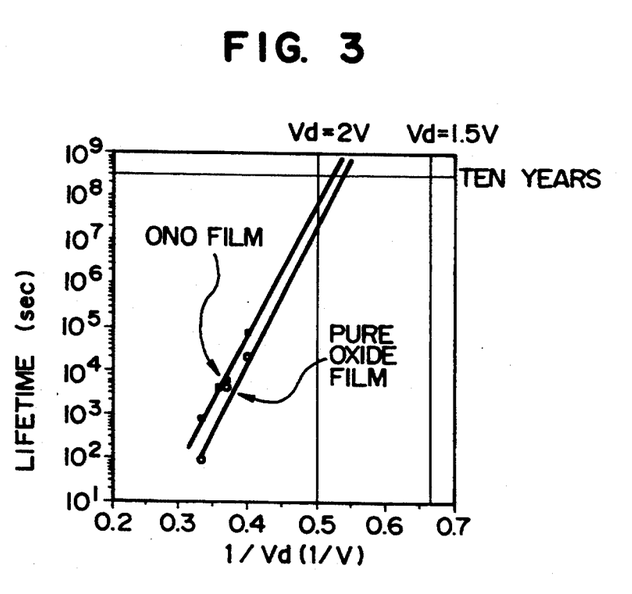
FIG. 3 is a diagram showing a comparison between $SiO_2$ film and ONO film used as the gate insulating film regarding the lifetime of MOS transistors with the channel length of 0.1 μm.

FIG. 3A is a diagram showing a comparison in the lifetime of the MOS transistor having a channel length of 0.1 μm between SiO$_2$ film and ONO film used as the gate insulating film thereof. In this figure, the abscissa represents the reciprocal of the drain-source voltage Vd, while the ordinate represents the lifetime (sec). The lifetime is longer for lower drain-source voltage Vd. If the drain-source voltage Vd is designed to be in a range corresponding to the lifetime in excess of ten years, the quality of MOS transistors can be guaranteed for ten years. As is apparent from this figure, the lifetime of MOS transistors with ONO film is about three times longer than that of MOS transistors with SiO$_2$ film.

According to this embodiment, it is possible to obtain a MOS semiconductor device which is excellent in reliability and driving capacity and greatly effective to prevent the punch-through of impurities from the gate electrode.

In the above-mentioned first embodiment, there is a problem that warping or slip occurs in the wafer caused by high temperature processing (~1000° C.) by RTP in the manufacture of the ONO film.

In rapid thermal nitridation by RTP, there are problems such that it is not easy to obtain a Si$_3$N$_4$ film 14 with a great thickness (e.g., 4.5 nm or more), and that it is also not easy to manufacture a Si$_3$N$_4$ film 14 with a stable film thickness partly because of the uneven purity of NH$_3$ or N$_2$O in the atmosphere for rapid thermal nitriding and partly because of the nonuniformity of the furnace atmosphere.

In the ONO film 16 manufactured as described, because the Si$_3$N$_4$ film 14 is thin, its electrical characteristics are sometimes substantially the same as in the gate insulating film formed only by SiO$_2$. For this reason, the drive voltage of the MOS transistor having the ONO film 16 as the gate insulating film may be limited to substantially the same degree as that in a MOS transistor having a SiO$_2$ film alone, so that it is difficult to use the MOS transistor using the ONO film 16 with high drive voltages which make its high-speed operation possible.

In a second embodiment, the thickness of the silicon nitride film as a component of the gate insulating film is controlled so as to be in a range of 4.5 nm to 14.86 nm by the CVD process (chemical vapor deposition process) which can control the film thickness relatively freely in a great thickness range. It should be noted that the lower limit of 4.5 nm is the minimum film thickness necessary for operating the transistor with a higher drive voltage than that hitherto used, and the upper limit of 14.86 nm is the maximum film thickness necessary for preventing the gate insulating film from exhibiting the memory effect caused by electrons being trapped in the gate insulating film in this invention.

The MOS-type semiconductor device in this embodiment is used in such a way that an electric field of less than 4.2 MV/cm is applied to the silicon nitride film of the gate insulating film. Note that the upper limit of 4.2 MV/cm is the lowest critical energy possessed by electrons which contribute to the memory action mentioned above.

This second embodiment will be described with reference to FIGS. 5 to 8.

Figure 5:
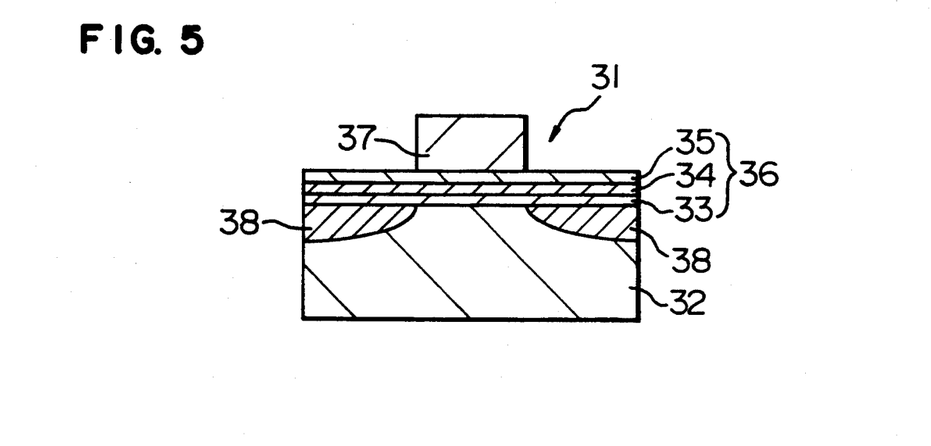
FIG. 5 is a sectional view showing the construction of a MOS semiconductor device according to a second embodiment of the present invention.

FIG. 5 is a schematic diagram showing the construction of a MOS transistor according to an embodiment of the present invention. In order to manufacture a MOS transistor 31, a SiO$_2$ film 33 of about 3 nm thickness is formed on the surface of a Si substrate 32 by the thermal oxidation process or the CVD process. Then, a Si$_3$N$_4$ film 34 of about 4 nm is deposited on the SiO$_2$ film 33 by the CVD process in a mixed atmosphere of dichlorosilane (SiH$_2$Cl$_2$) and ammonia (NH$_3$) at 700° C. subsequently, a SiO$_2$ film 35 of about 3 nm thickness is formed on the Si$_3$N$_4$ film 34 by the thermal oxidation process or the CVD process.

Thereafter, on the ONO film 36 having the films 33 to 35 used as the gate insulating film, a polycrystalline Si film 37 is formed in a pattern of a gate electrode and diffused layers 38 of source and drain are formed in the Si substrate 32 on both sides of the polycrystalline Si film 37.

Each of the SiO$_2$ films 33 and 35 has a thickness of 3 nm, which is required for preventing direct tunneling of holes, which is the main cause of a leak current of the ONO film 36. In this embodiment, the SiO$_2$ films 33 and 35 are provided at both upper and lower sides of the S$_3$N$_4$ film 34. The reason for this is to make the ONO film 36 in this embodiment applicable to any of an N-channel transistor and a P-channel transistor, and if the conductivity type of the channel is fixed, the SiO$_2$ film on the anodic side may be omitted.

Figure 6:
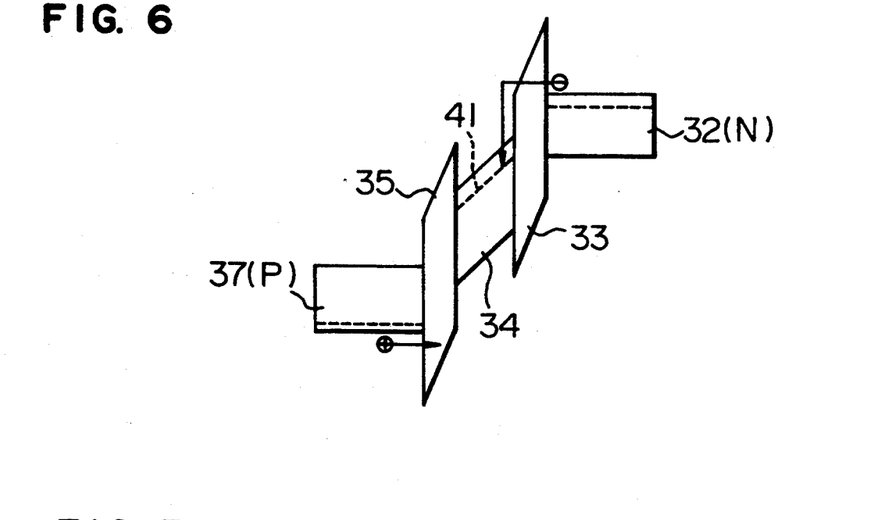
FIG. 6 is a band diagram showing potentials at various parts in a P-channel MOS transistor when a voltage is applied to the gate insulating film.

Meanwhile, the MOS transistor of this embodiment has a structure basically the same as that of a MONOS or SONOS (Metal-Oxide-Nitride-Oxide-Semiconductor or Silicon-Oxide-Nitride-Oxide-Semiconductor) and therefore, exhibits the memory effect when the supply voltage is higher than a certain voltage level or the Si$_3$N$_4$ film 34 has a thickness larger than a certain thickness. This memory (write) action occurs, as shown in FIG. 6, when the electrons, which has been injected from the cathode-side electrode and passed through the SiO$_2$ film 33 or the SiO$_2$ film 35 by the Fowler-Nordheim (hereafter referred to simply as "F-N") tunneling, are trapped at the trap level 41 of the acceptor type in the Si$_3$N$_4$ film 34.

At this time, as the energy possessed by the electrons flowing through the Si$_3$N$_4$ film 34 becomes larger, the electrons are trapped and held at deeper trap level. In contrast, the electrons trapped at a shallow trap level are easily released after the write operation is finished and consequently, those electrons do not contribute to the memory action.

Therefore, in order to make the MOS transistor 31 in this embodiment constructed as shown in FIG. 5 operative in the memory action, it is necessary to supply the electrons with energy greater than a critical energy and, therefore, there is a lower limit of the electric field strength for accelerating the electrons. It has been found that in the MONOS construction, the lower-limit electric field strength is 4.2 MV/cm. Therefore, in contrast, in order that the MOS transistor 31 in this embodiment operates in an ordinary MOS action without performing the memory action, it is required to use the MOS transistor with an electric field strength less than the above-mentioned level of the electric field strength.

Description will now be made of the maximum supply voltage which can be used with the MOS transistor in this embodiment.

If the electric field strengths applied to the SiO$_2$ films 33, 35 and the Si$_3$N$_4$ film 34 are designated, respectively, by E$_{ox}$ and E$_N$, since the electric flux densities in the respective films 33 to 35 are the same, we have the following equations:

$$\epsilon_{ox}\epsilon_o E_{ox} = \epsilon_N \epsilon_o E_N = \epsilon_{ox}\epsilon_o E_{ox} \quad (1)$$

where $\epsilon_{ox}$ is the relative permittivity of $SiO_2$ and $\epsilon_{ox}=3.9$, $\epsilon_N$ is the relative permittivity of $Si_3N_4$ and $\epsilon_N=7.5$, and so is the relative permittivity of vacuum and $\epsilon_o=8.854\times10^{-14}$ [F/cm].

The voltage Vc applied to the whole ONO film 36 is given by:

$$Vc=E_{ox}t_{ox}^T+E_N t_N+E_{ox}t_{ox}^B \quad (2)$$

where $t_{ox}^T$, $t_N$, and $t_{ox}^B$ are the film thicknesses of the $SiO_2$ film 35, the $Si_3N_4$ film 34, and the $SiO_2$ film 33, respectively.

From Eqs. (1) and (2), the following relation holds.

$$E_N=Vc/\{(t_{ox}^T+t_{ox}^B)(\epsilon_N/\epsilon_{ox})+t_N\} \quad (3)$$

By applying the upper limit electric field strength of 4.2 [MV/cm] required for preventing the MONOS device from performing the memory action to $E_N$, the following relation stands:

$$Vc/\{(t_{ox}^T+T_{ox}^B)(\epsilon_N/\epsilon_{ox})+t_N\}<4.2[MV/cm] \quad (4)$$

By applying $t_{ox}^T=t_{ox}^B=3$ [nm] in this embodiment to the above equation, we have $$Vc<4.84+0.42t_N \quad (5)$$

Further by applying $t_N=4$ [nm] in this embodiment to Eq. (5), Vc becomes as follows.

$$Vc<6.52[V] \quad (6)$$

Therefore, it is understood that the MOS transistor 31 is sufficiently suitable for operation with a supply voltage of 5 V. On the other hand, when the gate insulating film is formed only by $SiO_2$ film, the thickness of the $SiO_2$ film corresponding to this embodiment is 8 nm. The supply voltage for the conventional MOS transistor with this level of film thickness is 3.3 V. For this reason, the arrangement of this embodiment is more suitable for use with a higher supply voltage than the conventional one.

In the foregoing description, the condition for avoiding the memory action is mainly studied. On the other hand, the leak current flowing through the gate insulation layer becomes significant at an electric field strength of about 5 MV/cm or more. This electric field strength is higher than the 4.2 MV/cm electric field strength for avoiding the memory action and cannot be a factor which determines an actual usable limit of the supply voltage.

Figure 7:
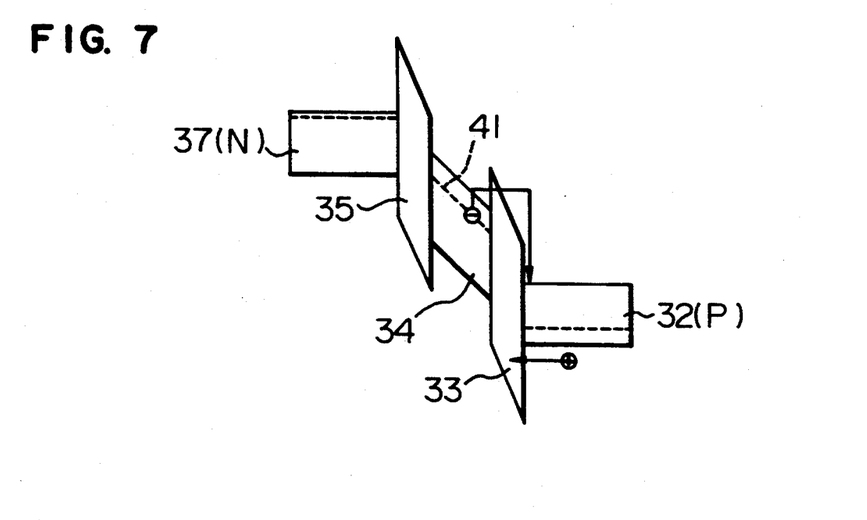
FIG. 7 is a band diagram showing potentials at various parts in an N-channel MOS transistor when a voltage is applied to the gate insulating film.

On the other hand, as shown in FIG. 6, the memory action of the MONOS structure is caused to occur by the electrons, which have been injected into the $Si_3N_4$ film 34 by F-N tunneling from the cathode-side electrode and trapped at the trap level 41 in this $Si_3N_4$ film 34. A proportion of the trapped electrons which are released and again injected into the Si substrate 32 (or the polycrystalline Si film 37) as shown in FIG. 7 is constant and therefore, in order to hold the electrons, it is necessary to have a quantity of electrons, which includes additional electrons corresponding to the released electrons, trapped or to provide a correspondingly higher trap level 41.

The total quantity of electrons to be trapped at the trap level 41 is controlled by the thickness of the $Si_3N_4$ film 34 and, therefore, in order to suppress the memory action, it is required to select the upper limit of the thickness of the $Si_3N_4$.

Figure 8:
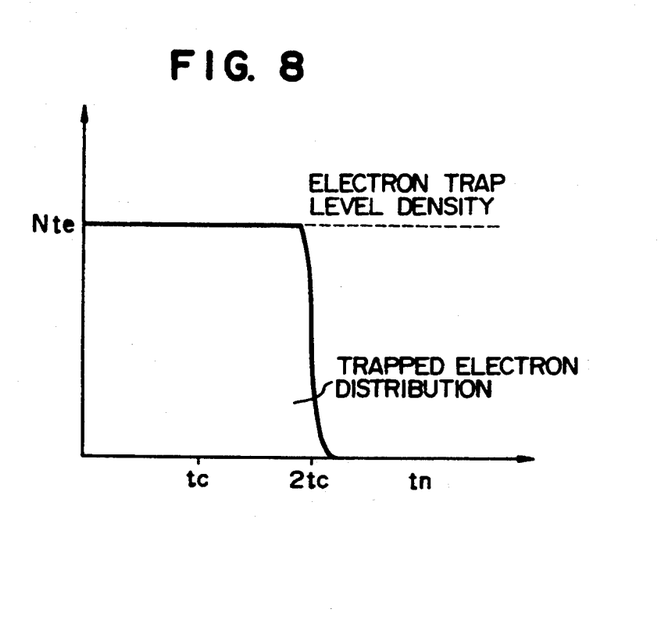
FIG. 8 is a diagram showing a density distribution of electrons trapped in $Si_3N_4$.

If the center of the distribution of the trapped electrons along the film thickness in the $Si_3N_4$ film is designated by tc, the trapped electrons are considered to be distributed as shown in FIG. 8.

Now assume that the tunnel release coefficients of the $Si_3N_4$ and the $SiO_2$ films 33, 35 are designated by $\alpha_N$ and $\alpha_{ox}$. Since there are routes through the $SiO_2$ films 33 and 35 for back-tunneling of the electrons, the probability P of tunnel releasing can be expressed as follows.

$$P=2\exp(-\alpha_N t_c)\cdot\exp(-\alpha_{ox}t_{ox}) \quad (7)$$

The mean time $\tau_o$ of an electron being released from the trap level 41 in the $Si_3N_4$ film is known as $\tau_0=10^{-13}$ [sec], and the memory is normally guaranteed to be held for ten years ($3.15\times10^8$) seconds. Therefore, the allowable number of electrons to be released is $$10^{-13}/(3.15\times10^8) \quad (8)$$

From the above value and Eq. (7), we obtain $$10^{-13}/(3.15\times10^8)=2\exp(-\alpha_N t_c)\cdot\exp(-\alpha_{ox}t_{ox}) \quad (9)$$

A third embodiment of the present invention will be described with reference to FIGS. 9, 10A to 10E.

Figure 9:
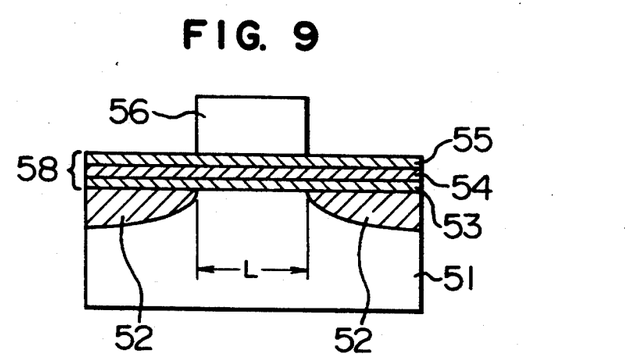
FIG. 9 is a sectional view showing the construction of a MOS transistor according to a third embodiment of the present invention.

FIG. 9 is a sectional view showing the construction of a MOS field-effect transistor according to the third embodiment.

The MOS field-effect transistor in FIG. 9 comprises, as main components, a pair of second conductivity type diffused layers 52, a gate insulating film 58, and a polysilicon gate electrode 56. The second conductivity type diffused layers 52 are formed in a first conductivity type semiconductor substrate 51 and separated from each other by a predetermined distance L corresponding to a channel region, preferably 0.1 μm or less, and one of the diffused layers 52 is used as the source and the other as the drain. The gate insulating film 58 is interposed between the gate electrode 56 and the first conductivity type semiconductor substrate 51, and has a multilayer construction formed on the transistor active region formed on the first conductivity type semiconductor substrate 51 and comprising a lower silicon oxide film 53 of a thickness of 3 nm or more, a silicon nitride film 54 of a thickness of 4.5 to 14.86 nm laminated on the lower silicon oxide film 53, and an upper silicon oxide film 55 formed on the silicon nitride film.

The method of manufacturing a MOS field-effect transistor according to this embodiment will be described with reference to FIGS. 10A to 10E.

Figure 10A:
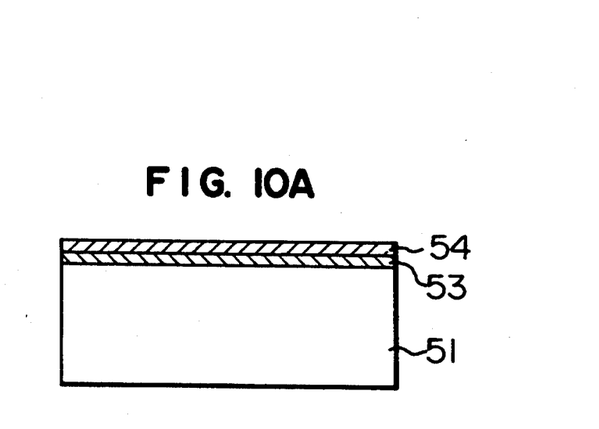
FIGS. 10A to 10E are diagrams showing the manufacturing steps of the MOS transistor of FIG. 9.

A transistor active region is formed on the first conductivity type semiconductor substrate 51 by using a selective oxidation process or the like. Then, in this transistor active region, a lower silicon oxide film 53 is formed to have a thickness of 3 nm by the thermal oxidation process for about ten minutes in a dry atmosphere including $O_2$ at a concentration of 1% at 800° to 900° C. for example Thereafter, a silicon nitride film 54 is deposited to a thickness of 4.5 to 14.86 nm by the low pressure CVD process by using a mixture of NH gas and SiHCl gas in a ratio of 10:1 (FIG. 10A).

Figure 10B:
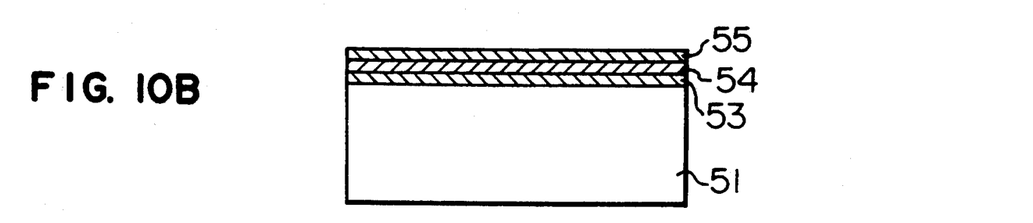

An upper silicon oxide film 55 of a thickness of 3 nm is formed on the silicon nitride film 54 by the thermal oxidation process in a steam atmosphere including H and O at a ratio of 1:2 at 850° C., for example (FIG.

Figure 10C:
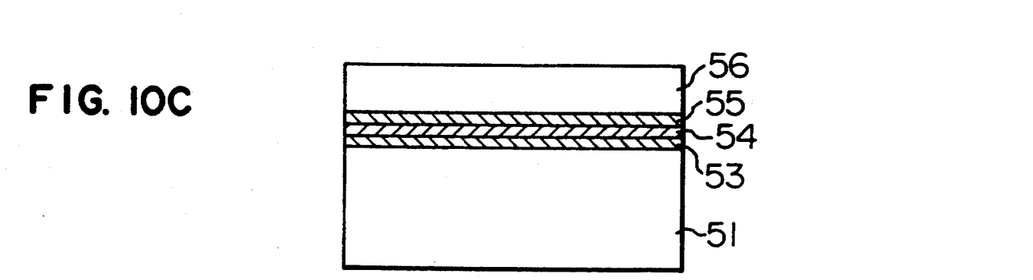
Figure 10D:
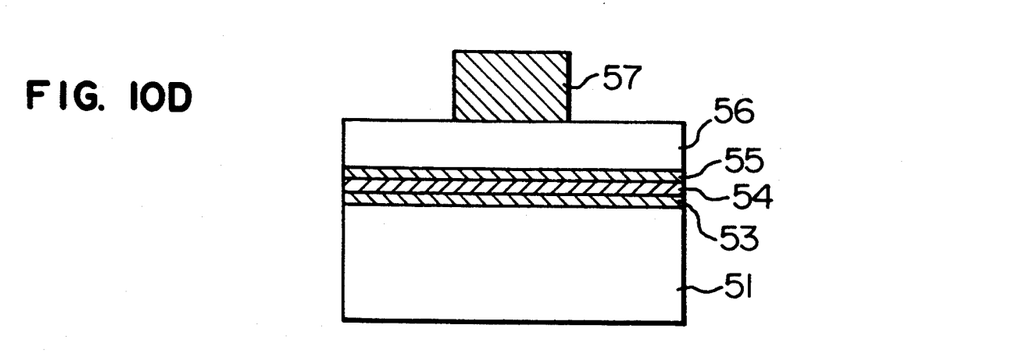
Figure 10E:
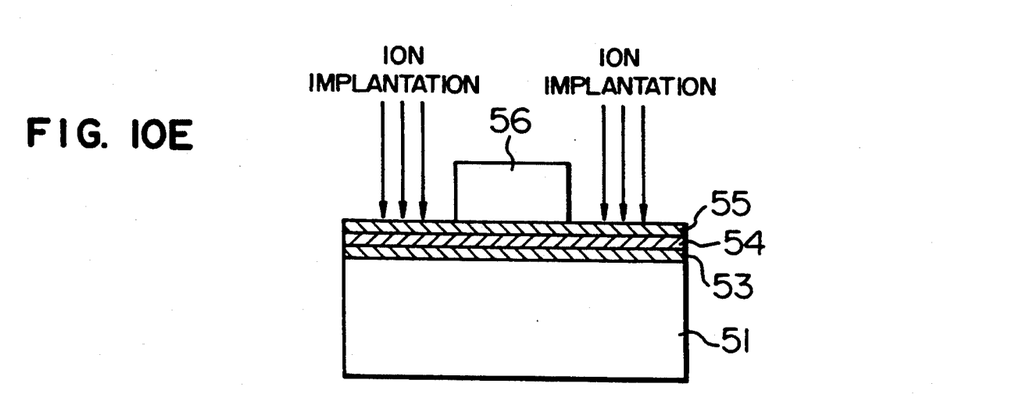

10B). Subsequently, a polysilicon layer 56 as the gate electrode is deposited on the upper silicon oxide film 55 by the low pressure CVD process (FIG. 10C). After patterning a photoresist 57 by the photolithographic process, a gate electrode 56 is formed by using the photoresist 57 as a mask (FIG. 10D). In self-alignment with the gate electrode 56 used as the mask, impurities of the second conductivity type, such as boron B, phosphorus P, arsenic As, or the like are implanted into the first conductivity type semiconductor substrate by ion implantation (FIG. 10E).

As a result, second conductivity type diffused layers 52 are formed in the surface of the first conductivity type semiconductor substrate 1, so that a MOS field-effect transistor of a construction shown in FIG. 9 is produced.

It should be noted that the upper silicon oxide film 55 may be formed also by CVD, for example, other than thermal oxidation, and when the silicon oxide film 55 is formed by CVD, the silicon nitride film 54 can be made thinner than in the above-mentioned embodiment. Also, the lower silicon oxide film 53 may be formed by CVD, or this oxide film 53 may be a naturally oxidized film.

Further, the upper silicon oxide film 55 and lower silicon oxide film 53 are formed to have a film thickness of 3 nm in order to prevent the injection of the anode side holes which may cause leak current or dielectric breakdown, since the potentials of various points of the transistor are in the same relationship as that shown in FIG. 6 or 7 depending on the polarity of the voltage applied to the gate insulating film 58 which is different depending on whether the MOS transistor is of N-channel or P-channel. Incidentally, the part designated by "37" in FIG. 6 corresponds to the P-type semiconductor substrate 51 of this embodiment and the part designated by "37" in FIG. 7 corresponds to the N-type semiconductor substrate 51 of this embodiment. Therefore, when all the MOS field-effect transistors each using the gate insulating film 58 are of the P-channel type or N-channel type, the anode-side silicon oxide film may be omitted thereby making the thickness of the gate insulating film smaller.

Description will now be made of a fourth embodiment of a semiconductor device comprising a plurality of MOS field-effect transistors according to the present invention in which all MOS field-effect transistors are of the P-channel type or N-channel type. A case where the N-channel type is used will first be discussed with reference to FIG. 11.

Figure 11:
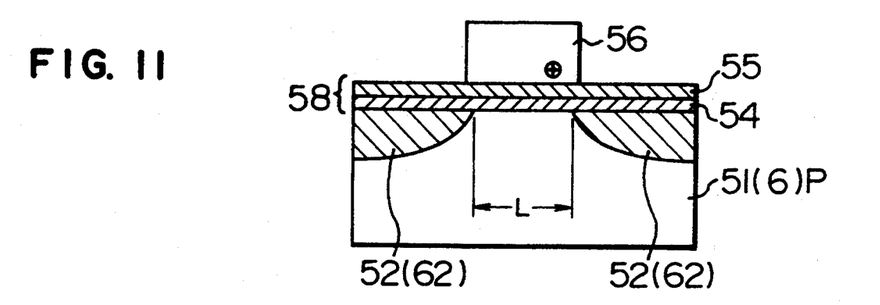
FIG. 11 is a sectional view showing the construction of a N-channel MOS transistor according to a fourth embodiment of the present invention.

A MOS field-effect transistor of the semiconductor device comprises a pair of second conductivity type diffused layers 52 (N-type diffused layers 62), a gate insulating film 58, and a gate electrode 56 made of an N-type polysilicon. The second conductivity type diffused layers 52 are formed in the first conductivity type semiconductor substrate 51 (P-type semiconductor substrate 61) and separated from each other by a predetermined distance L corresponding to the channel region, preferably 0.1 μm or less, and one of the diffused layers is used as the source and the other as the drain. The gate insulating film 58 is interposed between the gate electrode 56 and the first conductivity type semiconductor substrate 51, and has a multilayer construction comprising a silicon nitride film 54 of a thickness of 4.5 to 14.86 nm formed on the transistor active region formed in the first conductivity type semiconductor substrate 51, and an upper silicon oxide film 55 formed on the silicon nitride film.

The upper silicon oxide film 55 is used to prevent the inflow into the silicon nitride film 54 of holes as minority carriers in the N-type polysilicon of the gate electrode 56 when a gate voltage is applied. In this case, since a negative voltage is applied to the first conductivity type semiconductor substrate 51, no hole flows from the first conductivity type semiconductor substrate 51 into the silicon nitride film and therefore, the lower silicon oxide film may be omitted on the semiconductor substrate side.

Figure 12:
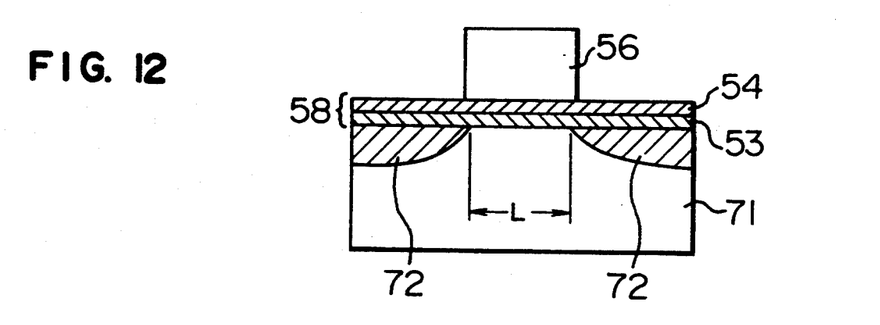
FIG. 12 is a sectional view showing the construction of a P-channel MOS transistor according to the fourth embodiment of the present invention.

Referring to FIG. 12, description will next be made of a semiconductor device comprising a plurality of MOS field-effect transistors according to this embodiment wherein all MOS field-effect transistors are P-channel type.

A MOS field-effect transistor of the semiconductor device, as shown in FIG. 12, comprises, as main components, a pair of P-type diffused layers 72, a gate insulating film 58, and a gate electrode 56 made of a polysilicon. The P-type diffused layers 57 are formed in the N-type semiconductor substrate 71 and separated from each other by a predetermined distance L corresponding to the channel region, preferably 0.1 μm or less, and one of the P-type diffused layers 72 is used as the source and the other as the drain. The gate insulating film 58 is interposed between the gate electrode 56 and the N-type semiconductor substrate 71, and has a multilayer construction comprising a lower silicon oxide film 53 of a thickness of 3 nm or more formed on the transistor active region formed in the N-type semiconductor substrate 71, and a silicon nitride film 54 of a thickness of 4.5 to 14.86 nm.

The lower silicon oxide film 53 is used to prevent the inflow into the silicon nitride film of holes from the P-type diffused layers 72 and from an inversion layer generated between the source and the drain when a gate voltage is applied. In this case, since a negative voltage is applied to the gate electrode 56, no hole flows from the gate electrode 56 into the silicon nitride film and, therefore, the upper silicon oxide film on the gate electrode side may be omitted.

The method of manufacturing a MOS field-effect transistor shown in FIG. 11 will be described with reference to FIGS. 13A to 13F.

Figure 13A:
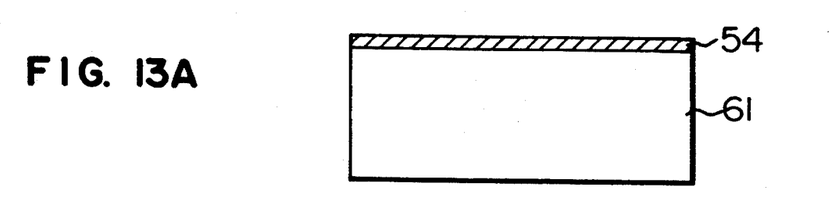
FIGS. 13A to 13F are diagrams showing the manufacturing steps of the MOS transistor of FIG. 11.
Figure 13B:
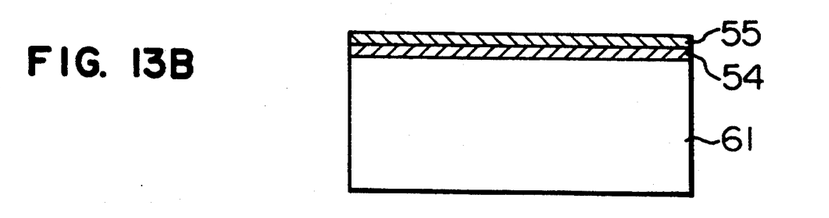
Figure 13C:
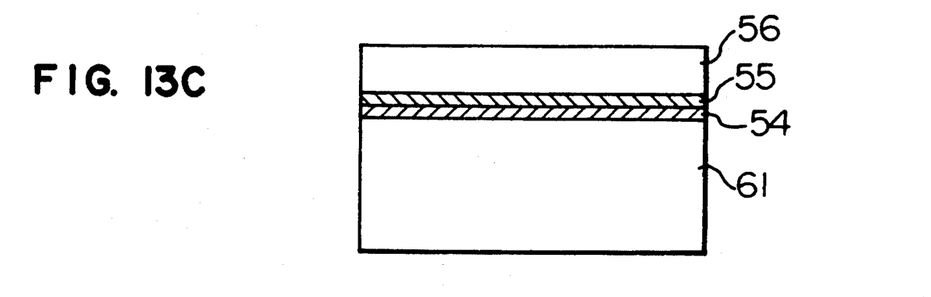
Figure 13D:
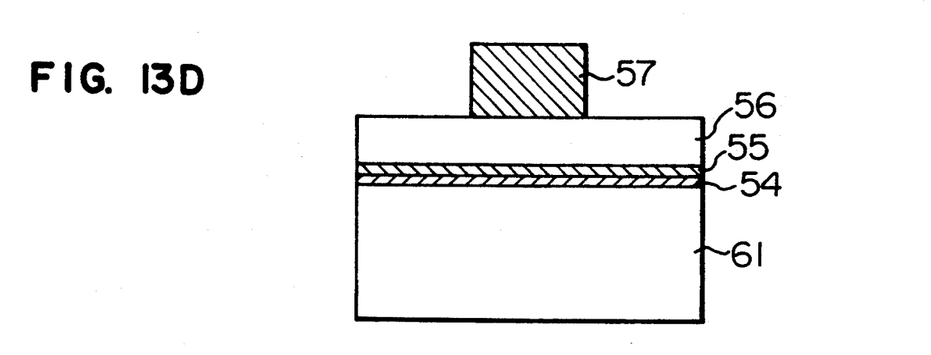
Figure 13E:
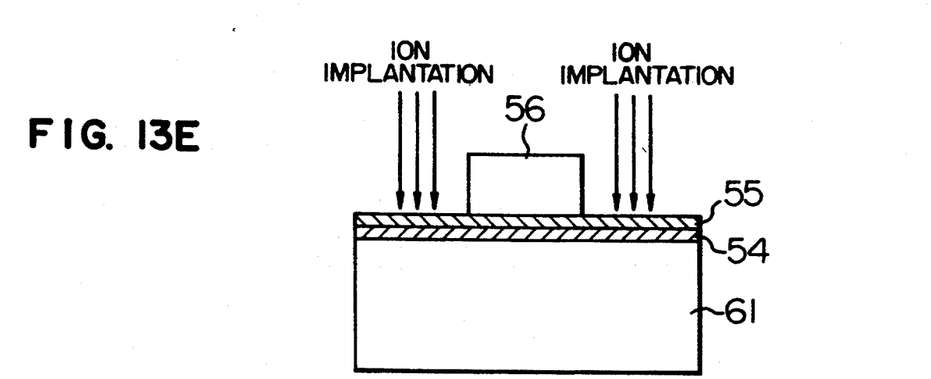

A transistor active region is formed in the P-type semiconductor substrate 51 by using the selective oxidation process. After this, on the transistor active region, a silicon nitride film 54 is deposited to a thickness of 4.5 to 14.86 nm by the low pressure CVD process using a mixture of NH gas and SiHCl gas at a ratio of 10:1 (FIG. 13A). On the silicon nitride film 54, an upper silicon oxide film 55 is formed to a thickness of 3 nm by thermal oxidation using a steam atmosphere of H and O at a ratio of 1:2 at 850° C. for example (FIG. 13B). On the upper silicon oxide film 55, a polysilicon layer to serve as the gate electrode is deposited by the low pressure CVD process (FIG. 13C), and after a photoresist is patterned by a photolithographic step, a gate electrode 56 is formed by using a mask of the photoresist 57 (FIG. 13D). In self-alignment with the gate electrode 56 used as a mask, N-type impurities such as boron B, phosphorus P, and arsenic As are implanted into the P-type semiconductor substrate 61 by ion implantation (FIG. 13E).

Figure 13F:
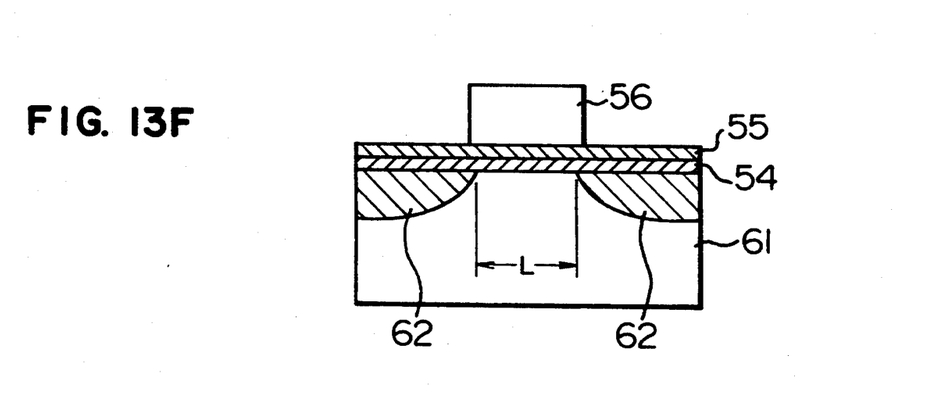

As a result, N-type diffused layers 62 are formed in the surface of the P-type semiconductor substrate 61 and, therefore, a MOS field-effect transistor of a construction shown in FIG. 13F is produced.

A method of manufacturing the MOS field-effect transistor shown in FIG. 12 will be described with reference to FIGS. 14A to 14E.

Figure 14A:
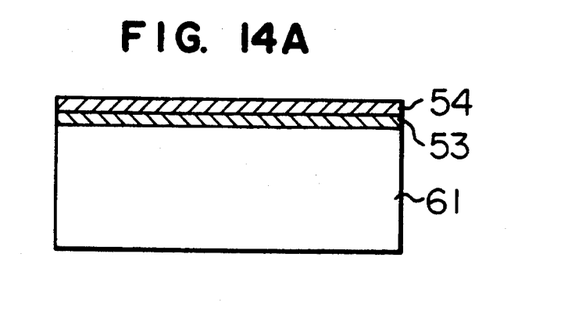
FIGS. 14A to 14E are diagrams showing the manufacturing steps of the MOS transistor of FIG. 12.
Figure 14B:
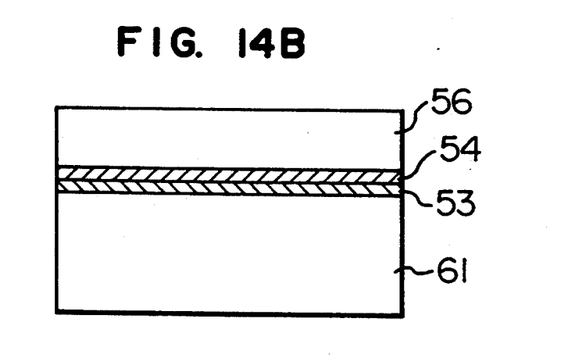
Figure 14C:
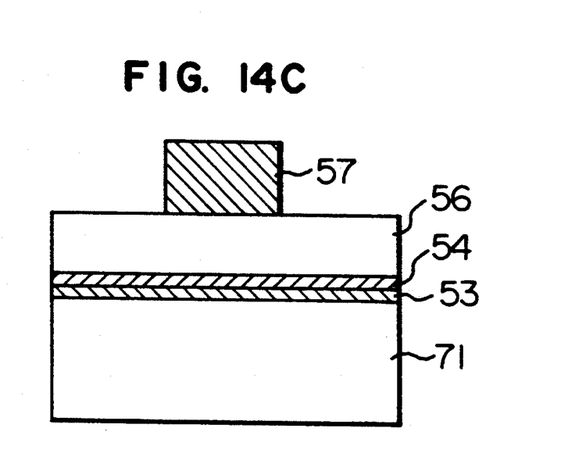
Figure 14D:
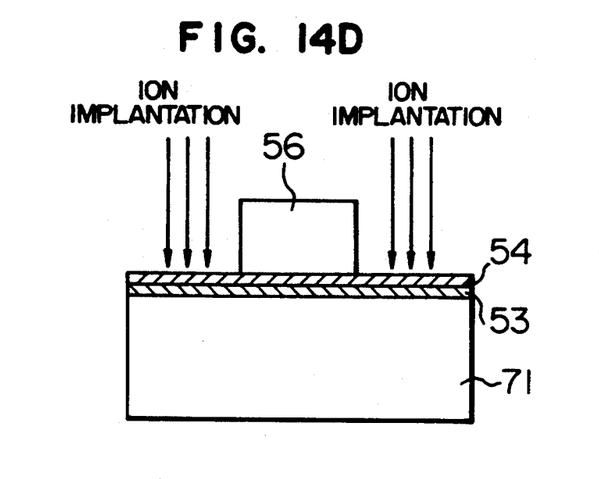

A transistor active region is formed in the N-type semiconductor substrate 71 by selective oxidation. Then, a lower silicon oxide film 53 is formed on the transistor active region to a thickness of 3 nm by thermal oxidation for about ten minutes in a dry atmosphere including $O_2$ of 1% concentration at 800° to 900° C. for example. On the lower silicon oxide film 53, a silicon nitride film 54 is deposited to a thickness of 4.5 to 14.86 nm by the low pressure CVD process using a mixture gas including NH and SiHCl at a ratio of 10:1 (FIG. 14A). Subsequently, on the silicon nitride film, a polysilicon layer serving as the gate electrode is deposited by the low pressure CVD process (FIG. 14B), and after a photoresist is patterned by photolithography, a gate electrode 56 is formed by using the photoresist as a mask (FIG. 14C). And then, P-type impurities such as aluminum Al are implanted into the N-type semiconductor substrate 71 by ion implantation in self-alignment with the gate electrode 56 used as a mask (FIG. 14D).

Figure 14E:
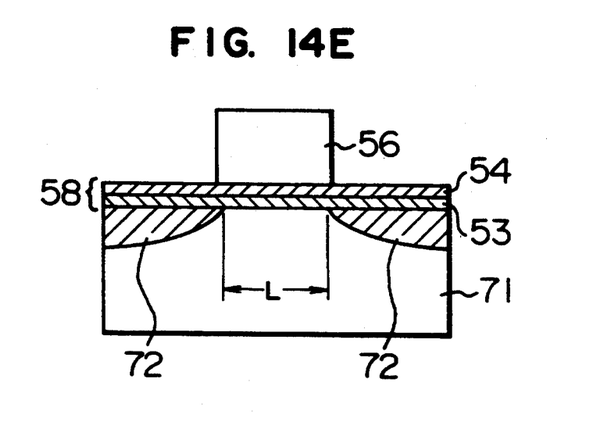

As a result, P-type diffused layers 72 are formed in the surface of the N-type semiconductor substrate 71, so that a MOS field-effect transistor of a construction as shown in FIG. 14E is produced.

Note that the upper silicon oxide film 55 may be formed by CVD, for example, other than thermal oxidation, and in this case, the thickness of the silicon nitride film 54 can be made further smaller than in the above embodiment. The lower silicon oxide film 53 may be formed also by CVD, or may be a naturally oxidized film.

As has been described, according to this embodiment, it is possible to realize a method of manufacturing a gate insulating film for a MOS field-effect transistor, which is stable with reduced possibility of warping or crystal defects occurring in the semiconductor wafer, and it is also possible to realize a gate insulating film for a MOS field-effect transistor, which is advantageous in microminiaturization of transistors and which allows the transistor to be driven by a high supply voltage.

We claim:

1. A MOS semiconductor device comprising:
   a semiconductor substrate of a first conductivity type;
   a pair of impurity diffused layers of a second conductivity type different from said first conductivity type and separated from each other by a distance of 0.1 μm or less;
   a gate insulating film including at least three layers of a silicon oxide film, a silicon nitride film and a silicon oxide film and formed on a portion of said semiconductor substrate disposed between said pair of impurity diffused layers; and a gate electrode formed on said gate insulating film.

2. A MOS semiconductor device according to claim 1, wherein said gate insulating film is an ONO film including a silicon oxide film, a silicon nitride film, and a silicon oxide film laminated in that order.

3. A MOS semiconductor device according to claim 1, wherein said silicon nitride layer has a thickness of 4.5 nm or more.

4. A MOS semiconductor device according to claim 3, wherein said silicon nitride film has a thickness of 14.86 nm or less.

5. A MOS semiconductor device according to claim 1, wherein said MOS semiconductor device is of a P-channel type, said gate insulting film has a two-layer construction of said silicon oxide film and said silicon nitride film, and said silicon oxide film is disposed between said silicon nitride film and said substrate.

6. A MOS semiconductor device according to claim 1, wherein said MOS semiconductor device is of an N-channel type, said gate insulating film has a two-layer construction of said silicon oxide film and said silicon nitride film, and said silicon oxide film is disposed between said silicon nitride film and said gate electrode.

7. A MOS semiconductor device comprising:
   a semiconductor substrate of a first conductivity type;
   a pair of impurity diffused layers of a second conductivity type different from said first conductivity type formed in said semiconductor substrate and separated from each other by a of 0.1 μm or less;
   a gate insulating film formed on a portion of said semiconductor substrate disposed between said pair of impurity diffused layers and including at least two layers of a silicon oxide film and a silicon nitride film, said silicon nitride film having a thickness of 4.5 to 14.86 nm; and
   a gate electrode formed on said gate insulating film.

8. A MOS semiconductor device according to claim 7, wherein said gate insulating film is an ONO film including three layers of a silicon oxide film, a silicon nitride film, and a silicon oxide film.

9. A MOS semiconductor device according to claim 7, wherein said MOS semiconductor device is of a P-channel type, said gate insulating film has a two-layer construction of said silicon oxide film and said silicon nitride film, and said silicon oxide film is disposed between said silicon nitride film and said substrate.

10. A MOS semiconductor device according to claim 7, wherein said MOS semiconductor device is of an N-channel type, said gate insulating film has a two-layer construction of said silicon oxide film and said silicon nitride film, and said silicon oxide film is disposed between said silicon nitride film and said gate electrode.

11. A method of making a MOS semiconductor device comprising the steps of:
    forming a gate insulating film including at least three layers of a silicon oxide film, a silicon nitride film and a silicon oxide film on a first region of a semiconductor substrate of a first conductivity type, said silicon nitride film being formed by chemical vapor deposition;
    forming a gate electrode having a length of 0.1 μm or less on said gate insulating film; and
    forming, by using said gate electrode as a mask, a pair of impurity diffused layers of a second conductivity type different from said first conductivity type on a pair of second regions adjacent to and extending on both sides of said first region of the semiconductor substrate, said pair of impurity diffused layers being separated from each other by a distance of 0.1 μm or less.

12. A method according to claim 11, wherein said silicon nitride film has a thickness of 4.5 nm or more.

13. A method according to claim 12, wherein said silicon nitride film has a thickness of 14.86 nm or less.

14. A method of making a MOS semiconductor device comprising the steps of:
    forming a first silicon oxide film on a semiconductor substrate of a first conductivity type;
    forming a silicon nitride film on said first silicon oxide film by chemical vapor deposition;

forming a second silicon oxide film on said silicon nitride film;

forming a conductive layer to be used for a gate electrode on said second silicon oxide film;

forming a gate electrode having a length of 0.1 μm or less from said conductive layer by etching said first and second silicon oxide films, said silicon nitride film and said conductive layer; and forming a pair of impurity diffused layers of a second conductivity type different from said first conductivity type in self-alignment with said gate electrode used as a mask, said pair of impurity diffused layers being separated from each other by a distance of 0.1 μm or less.

15. A method according to claim 14, wherein the thickness of said silicon nitride film is in a range of 4.5 nm to 14.86 nm.

* * * * *